United States Patent [19]
Kannapell et al.

[11] Patent Number: 5,621,472
[45] Date of Patent: Apr. 15, 1997

[54] SYSTEM FOR INEXPENSIVE PHASE COHERENT SUBCARRIER GENERATION

[75] Inventors: Henry N. Kannapell, Gainesville, Ga.; Lawrence F. Heyl, Mountain View, Calif.

[73] Assignee: Apple Computer, Inc., Cupertino, Calif.

[21] Appl. No.: 222,739

[22] Filed: Apr. 1, 1994

[51] Int. Cl.$^6$ .............................. H04N 9/45; H04N 9/455
[52] U.S. Cl. ...................... 348/505; 348/537; 348/549
[58] Field of Search ................... 348/505, 521, 348/524, 536, 537, 549; H04N 9/45, 9/455

[56] References Cited

U.S. PATENT DOCUMENTS

| | | |
|---|---|---|
| 4,328,513 | 5/1982 | Furihato et al. . |
| 4,974,082 | 11/1990 | Heitmann ................. 348/537 |
| 5,025,310 | 6/1991 | Sekiya et al. . |
| 5,095,279 | 3/1992 | Quan et al. . |
| 5,298,998 | 3/1994 | Furumiya et al. ................. 348/537 |

FOREIGN PATENT DOCUMENTS

| | | |
|---|---|---|
| 0181952 | 11/1984 | European Pat. Off. . |
| 0198529 | 3/1986 | European Pat. Off. . |
| 0217648 | 9/1986 | European Pat. Off. . |
| 0408439 | 7/1990 | European Pat. Off. . |
| 0483467 | 8/1991 | European Pat. Off. . |
| 0535945 | 9/1992 | European Pat. Off. . |
| 0564084 | 2/1993 | European Pat. Off. . |
| 0588499 | 8/1993 | European Pat. Off. . |
| 2647620 | 5/1990 | France . |
| 3402796 | 1/1984 | Germany . |
| 4007450 | 3/1990 | Germany . |
| 59-13499 | 8/1984 | Japan . |
| 9009723 | 8/1990 | WIPO . |

*Primary Examiner*—Victor R. Kostak
*Attorney, Agent, or Firm*—David J. Larwood

[57] ABSTRACT

The present invention is a system for inexpensive phase coherent subcarrier generation. The subcarrier sequence has a fairly short periodicity (two lines), allowing a relatively short lookup table to hold coded values precisely representing the sampled subcarrier. A variety of modulation techniques may be employed to minimize the error between the reconstructed subcarrier sine wave and an "ideal" subcarrier sine wave. The SCH phase may be easily varied by using a different table of subcarrier sine wave values.

16 Claims, 1 Drawing Sheet

SYSTEM FOR INEXPENSIVE PHASE COHERENT SUBCARRIER GENERATION

BACKGROUND OF THE INVENTION

The present invention relates generally to television signal encoding, and more particularly to the generation of a phase coherent National Television Standards Committee (NTSC) subcarrier.

Specialized combinations of computer hardware and software, such as QuickTime® by Apple Computer, Inc., allow users to create and edit video movies using a combination of video, graphics, and sound data. Each frame of a movie exists in a digitized baseband (usually red, green, and blue, or RGB) component format, which allows the images to be stored and manipulated by a computer. While the digitized baseband format is ideal for creating and editing movie frames on a computer, this format is not compatible with interlaced television systems or video cassette recorders (VCRs), which require a composite television signal (such as NTSC) as an input.

As is well known to those skilled in the art, the RGB component format can be easily transformed to a basis suitable for NTSC television signal encoding. NTSC composite television signals are generated by combining a baseband luminance (Y) component with two QAM encoded chrominance components (I and Q). Quadrature amplitude modulation encoding, or QAM, is the suppressed carrier amplitude modulation of two subcarriers in quadrature. That is, the baseband I signal is used to modulate an analog sinusoidal subcarrier $f_{sc}$, and the baseband Q signal is used to modulate a 90° phase shifted version of $f_{sc}$. In the NTSC standard, $f_{sc}$ is defined to be a 3.579545 MHz (±1 Hz) sinusoidal signal. This, and other signal parameters of the NTSC standard can be found in "Report 624-4, Characteristics of Television Systems," *Reports of the CCIR*, 1990.

Currently, there are several ways to generate the sinusoidal subcarrier required for QAM encoding of the chrominance components. In the simplest, least accurate systems, $f_{sc}$ can be generated with an oscillator unlocked to the scan or sample rates of the system. This can lead to difficulties in maintaining the phase coherency of the subcarrier. Other, more complex systems incorporate phase locked loop circuitry to more accurately generate a phase coherent subcarrier. In yet another approach, a digital frequency synthesizer is used to generate a sequence of samples that may be used to derive $f_{sc}$.

While each of these systems works for its intended purpose, the systems capable of generating a highly accurate phase coherent subcarrier are expensive, and can be difficult to implement in a system where the subcarrier frequency is not conveniently related to the video sampling rate or one of its harmonics. For example, the duration of a horizontal scan line is defined to be (in the NTSC standard) 63.5555 µsec, 10.7 µsec of which is used for horizontal blanking. Thus, 52.8555 µsec per scan line contains picture information. In a system having 640 pixels per scan line, each pixel is presented for (52.8555 µsec per line/640 pixels per line)= 82.586717 nsec per pixel. This implies that a sample rate of (1/82.586717 nsec)=12.108484 MHz must be used to accurately sample each pixel.

As can be shown with simple division, the relationship between this sample rate and $f_{sc}$ is not a simple one: (12.108484 MHz/3.579545 MHz)=3.382688. Thus, deriving $f_{sc}$ by using the horizontal sampling frequency as a reference is not practical.

Accordingly, an object of the present invention is to simply and efficiently generate a phase coherent NTSC subcarrier by using commonly available digital video processing signals as a reference, when such signals do not have a simple relationship to the NTSC subcarrier frequency.

Additional objects and advantages of the invention will be set forth in part in the description which follows, and in part become apparent to those skilled in the art upon examination of the following, or may be learned by practice of the invention. The objects and advantages of the invention may be realized and obtained by means of the instrumentalities and combinations particularly pointed out in the claims.

SUMMARY OF THE INVENTION

The present invention includes a system for inexpensive phase coherent generation of a periodic signal. Such a system includes a binary counter, a lookup table, a parallel to serial converter, and a bandpass filter. An output from the binary counter is used to address the lookup table, which then generates a digital output signal representative of a periodic signal. The digital output of the lookup table is converted to a serial digital signal by the parallel to serial converter, and then the serial digital signal is filtered to reconstruct the continuous signal.

BRIEF DESCRIPTION OF THE DRAWING

The accompanying drawing, which is incorporated in and constitutes a part of the specification, schematically illustrates a preferred embodiment of the invention and, together with the general description given above and the detailed description of the preferred embodiment given below, serves to explain the principles of the invention.

DESCRIPTION OF THE PREFERRED EMBODIMENT

Figure 1:
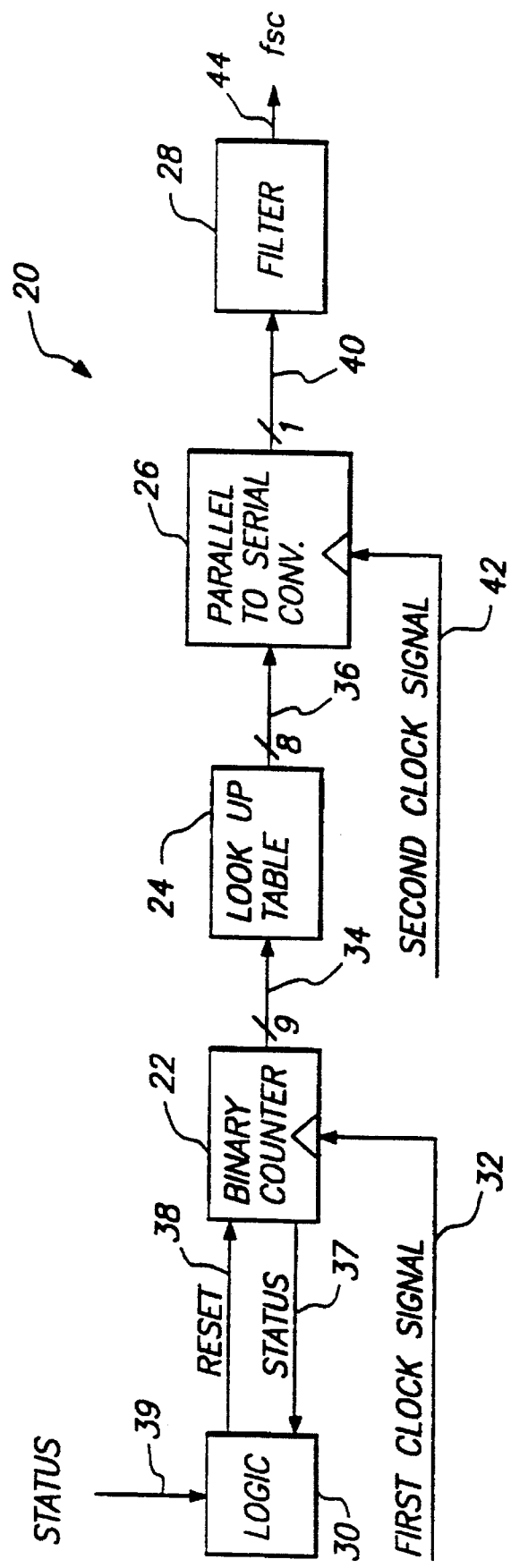
FIG. 1 is a block diagram of a system for phase coherent NTSC subcarrier generation according to the present invention.

The present invention will be described in terms of the preferred embodiment, which is a system for inexpensive phase coherent NTSC subcarrier generation (PCSG). Such a system is shown in FIG. 1, where the PCSG is referred to by general reference numeral 20.

In the NTSC standard (and distinct from other composite television standards), the subcarrier frequency $f_{sc}$ is defined to be 227.5 times the horizontal line frequency. This implies that a uniform sampling of the subcarrier will generate a sequence that repeats every two lines. It is this relationship between the horizontal line frequency and $f_{sc}$ that allows PCSG 20 to economically generate a phase coherent NTSC subcarrier.

Referring now to the drawing, FIG. 1 shows a block diagram of PCSG 20 according to the present invention. PCSG 20 may be incorporated in a video processing system (not shown) which generates the baseband YIQ (or RGB) signals to be encoded. PCSG 20 includes a binary counter 22, a lookup table 24, a parallel to serial converter 26, a band pass filter 28, and a control logic circuit 30.

In a preferred embodiment, counter 22 is clocked (by clock signal 32) at 2.25 MHz, which is a frequency commonly used in the art to sample digital video signals. Binary counter 22 generates as its output a parallel output signal 34, which increases with every cycle of clock signal 32. Binary counter 22 is reset every two horizontal lines, which is every (2×63.5555 μsec)=127.111 μsec. This implies that parallel output signal 34 must be able to represent at least ((2.25×10$^6$ cycles/second)×(127.111×10$^{-6}$ seconds))=286 cycles of clock signal 32. Therefore, parallel output signal 34 must be at least 9 bits wide in the preferred embodiment, although parallel output signal 34 may have more or fewer bits depending on the frequency of clock signal 32, and the frequency with which binary counter 22 is reset.

Parallel output signal 34 is used to address lookup table 24, which contains a series of coded values that precisely represent the sinusoidal subcarrier $f_{sc}$, preferably sampled at the rate of 8 times the clock signal 32 (here, 2.25 MHz) at one bit resolution and then grouped into 8 bit samples. Because the frequency of clock signal 32 may be less than the frequency of $f_{sc}$, parallel output signal 36 generated by lookup table 24 may represent more than one cycle of $f_{sc}$. In a preferred embodiment, parallel output signal 36 is 8 bits wide, although more or fewer bits may be used.

Control logic circuit 30 receives information about the status of binary counter 22 via status signal 37. Status signal 37 may include information such as the value of parallel digital output signal 34. Control logic circuit 30 may also review information about the status of an external video processing system (not shown) via status signal 39.

Control logic 30 generates a reset signal 38 used to reset counter 22 after the end of each two line sequence. Preferably, counter 22 is also reset at the start of the first line of each odd field to maintain correct synchronization between $f_{sc}$ and the external video processing system. Counter 22 may also be reset as needed throughout the NTSC four field color frame to maintain SubCarrier-Horizontal (SCH) phase. In applications where the SCH phase must be varied, the contents of lookup table 24 may simply be offset by a predetermined amount to represent a constant phase shift. SCH phase, and other details of the NTSC standard are well known to those skilled in the art, and will not be discussed further to avoid obscuring the present invention.

Lookup table 24 may contain data that represents the sampled subcarrier sine wave in a number of different but equivalent ways. The most straightforward representation is that of linear pulse code modulation (PCM). However, since PCM requires a digital-to-analog converter (not shown), it is not the most cost effective implementation. Also, PCM cannot be implemented if the frequency of clock signal 32 is less than two times $f_{sc}$.

In a preferred embodiment, $f_{sc}$ is represented as a sequence of binary values, most easily chosen as +1 when $\sin(2\pi f_{sc}t)$ is greater than zero, and as 0 when $\sin(2\pi f_{sc}t)$ is less than or equal to zero. This technique will be referred to as "sign bit" modulation. Delta modulation and delta-sigma modulation are also possible.

The 8-bit parallel output 36 of lookup table 24 is used as an input by parallel-to-serial converter 26. In a preferred embodiment, parallel-to-serial converter 26 is a shift register. Parallel-to-serial converter 26 converts the 8-bit parallel signal 36 into a 1-bit serial output signal 40. Since the 8-bit parallel signal 36 is preferably sampled at 2.25 MHz, parallel-to-serial converter 26 must generate serial output 40 at a rate of (8×2.25 MHz)=18 MHz. Clock signal 42 is used to provide parallel-to-serial converter 26 with an 18 MHz reference. In an alternative embodiment, lookup table 24 may itself generate the serial output signal 40, eliminating the need for parallel to serial converter 26; however, lookup table 24 must operate at 8 times the speed required in the preferred embodiment.

Serial output signal 40 is a digital signal that alternates between 1 (logic high) and 0 (logic low). Since signal 40 is sampled at 18 MHz, and $f_{sc}$ is 3.579545 MHz, signal 40 is an alternating series of 2 or 3 logic high samples, followed by a series of 2 or 3 logic low samples. This results in what is essentially a square wave, with the logic high and logic low portions separated by a predetermined voltage or range of voltages.

Next, serial output 40 is filtered by band pass filter 28, which generates as its output 44 a sinusoidal subcarrier $f_{sc}$ having a frequency of approximately 3.579545 MHz, and reasonably good spectral purity. The requirements of filter 28 are fairly modest, and can be met easily with a single parallel resonant inductor-capacitor (LC) circuit.

It will be apparent to those skilled in the art that the frequencies of clock signals 32 and 42 may be changed, depending on the type and frequency of external signals available to PCSG 20. It will also be apparent that the frequency of clock signal 42 must equal the frequency of clock signal 32 times the number of bits in output signal 36.

If the frequency of clock signal 32 is high enough, other well known binary encoding schemes, such as pulse width modulation, delta modulation, or delta-sigma modulation may be used to encode the representation of $f_{sc}$ stored in lookup table 24. These other schemes may be used to suppress outband components (i.e., harmonics) which may occur with the simple "sign bit" modulation technique described above.

The present invention has been described in terms of a preferred embodiment. The invention, however, is not limited to the embodiment depicted and described. Rather, the scope of the invention is defined by the appended claims.

What is claimed is:

1. A system for generating a subcarrier, comprising:
   a binary counter having an output which generates a first parallel digital output signal;
   said binary counter coupled to a first clock signal having a first frequency, said first parallel digital output signal increasing with each cycle of said first clock signal;
   a lookup table, coupled to said first parallel digital output signal, for generating a second parallel digital output signal representative of said subcarrier;
   a parallel-to-serial converter, coupled to said second parallel output signal, for converting said second parallel digital output signal to a serial digital output signal;
   a filter, having an input and an output;
   said input of said filter coupled to said serial digital output signal; and
   said subcarrier generated at said output of said filter.

2. The system of claim 1 wherein said subcarrier is for a signal having horizontal scan lines, said system further including logic which resets said binary counter at the end of every two horizontal scan lines.

3. The system of claim 1 wherein said subcarrier is for a signal having lines and even and odd fields, said system further including logic which resets said binary counter at the start of the first line of each odd field, to maintain correct synchronization of said subcarrier.

4. The system of claim 1 wherein said subcarrier has a horizontal phase and is for a color video signal having a four field color frame, said system further including logic which resets said binary counter at any time throughout the four field color frame to maintain said subcarrier-horizontal phase.

5. The system of claim 1 wherein said first frequency is 2.25 MHz.

6. The system of claim 1 wherein said first parallel digital output signal is 9 bits wide.

7. The system of claim 1 wherein said second parallel digital output signal is 8 bits wide.

8. The system of claim 1 wherein said parallel-to-serial converter is coupled to a second clock signal having a second frequency.

9. The system of claim 8 wherein said second frequency is approximately 18 MHz.

10. The system of claim 1 wherein said filter is a parallel resonant inductor-capacitor circuit.

11. The system of claim 1 wherein said subcarrier has a frequency of approximately 3.579545 MHz.

12. A system for generating a periodic signal, comprising:
  a binary counter having an output which generates a first parallel digital output signal;
  said binary counter coupled to a first clock signal having a first frequency, said first parallel digital output signal increasing with each cycle of said first clock signal;
  a lookup table, coupled to said first parallel digital output signal, for generating a serial digital output signal representative of said periodic signal using modulation from the group consisting of sign bit modulation, delta modulation and delta-sigma modulation;
  a filter, having an input and an output;
  said input of said filter coupled to said serial digital output signal; and
  said periodic signal generated at said output of said filter.

13. A system for generating a periodic signal, comprising:
  a counter having an output which generates a first parallel digital output signal;
  said counter coupled to a first clock signal having a clock frequency, said first parallel digital output signal increasing with each cycle of said first clock signal and having a counter frequency;
  a lookup table, coupled to said first parallel digital output signal, for generating a serial digital output signal representative of said periodic signal and having a output frequency, said output frequency being different than said counter frequency;
  a filter, having an input and an output;
  said input of said filter coupled to said serial digital output signal; and
  said periodic signal generated at said output of said filter.

14. The system of claim 13 wherein said lookup table generates said serial digital output signal using binary encoded scheme modulation.

15. The system of claim 14 wherein said binary encoding scheme is from the group consisting of sign bit modulation, delta modulation and delta-sigma modulation.

16. The system of claim 13 wherein said output frequency is a non-integer multiple of said clock frequency.

* * * * *